United States Patent [19]

Sasaki

[11] Patent Number: 5,168,366
[45] Date of Patent: Dec. 1, 1992

[54] DYNAMIC SEMICONDUCTOR MEMORY DEVICE COMPRISING A SWITCHING TRANSISTOR AND STORAGE CAPACITOR

[75] Inventor: Masayoshi Sasaki, Tokyo, Japan

[73] Assignee: Oki Electric Industry Co., Ltd., Tokyo, Japan

[21] Appl. No.: 600,247

[22] Filed: Oct. 22, 1990

Related U.S. Application Data

[63] Continuation of Ser. No. 387,374, Jul. 28, 1989, abandoned, which is a continuation-in-part of Ser. No. 149,166, Jan. 27, 1988, abandoned.

[30] Foreign Application Priority Data

Jan. 27, 1987 [JP] Japan ................... 62-15304

[51] Int. Cl.⁵ ............ H01L 29/68; H01L 29/78; H01L 29/92; H01L 29/06
[52] U.S. Cl. ..................... 257/297; 257/303; 257/304; 357/51; 357/55
[58] Field of Search ............ 357/23.6, 51, 55

[56] References Cited

U.S. PATENT DOCUMENTS 4,688,063 8/1987 Lu et al. ................. 357/51
4,803,535 2/1989 Taguchi ................. 357/55

FOREIGN PATENT DOCUMENTS 015487162-24-
7561 9/1985 European Pat. Off. ......... 357/23.6
56-37663 1/1981 Japan .................. 347/23.6
62-247561 10/1987 Japan .

OTHER PUBLICATIONS

IEEE Translations on Electron Devices, vol. ED-32, No. 2; Feb. 1985; "Scaling Considerations and Dielectric Breakdown Improvement of a Currugated Capacitor Cell for a Future dRMA"; Sunami et al.; pp. 296 and 297.
Extended Abstracts of the 18th (1986 International) Conference on Solid State Devices and Materials, Tokyo, 1986, pp. 73-76 "Submicron MOSFETs with S/D Diffusions on a Field Insulator" Hiroshi Inokawa, et al.

Primary Examiner—J. Carroll
Attorney, Agent, or Firm—Wenderoth, Lind & Ponack

[57] ABSTRACT

In a semiconductor memory device having a memory cell comprising a switching transistor and a storage capacitor, a storage electrode of the capacitor is formed of at least part of a poly-silicon film deposited on an insulating film selectively formed on a silicon substrate, and the transistor comprises a MOS transistor having a channel region formed in a silicon epitaxial layer grown on the silicon substrate simultaneously with the deposition of said poly-silicon film, and has a source region at least part of which is formed in at least part of said poly-silicon film.

8 Claims, 3 Drawing Sheets

DYNAMIC SEMICONDUCTOR MEMORY DEVICE COMPRISING A SWITCHING TRANSISTOR AND STORAGE CAPACITOR

This application is a continuation of now abandoned application, Ser. No. 07/387,374 filed on Jul. 28, 1989, which was a continuation-in-part of now abandoned application Ser. No. 07/149,166 filed on Jan. 27, 1988.

BACKGROUND OF THE INVENTION

The present invention relates to a semiconductor memory device, particularly a dynamic random access memory and its cell structure.

A known semiconductor memory device comprises a switching transistor having a source region, a drain region and a channel region which are formed in a silicon substrate, and a storage capacitor having a storage electrode formed on an insulating film on the silicon substrate and electrically connected to the source region, another insulating film on the storage electrode, and a cell plate on the insulating film that is on the storage electrode.

In such a memory device, a large area is required for the connection of the switching transistor and the storage electrode, and this places a limitation to the size reduction.

SUMMARY OF THE INVENTION

An object of the invention is to enable a further reduction in size.

According to one aspect of the invention, there is provided a semiconductor memory device having a memory cell comprising a switching transistor and a storage capacitor, wherein said capacitor comprises a storage electrode formed of at least part of a poly-silicon film deposited on an insulating film selectively formed on a silicon substrate, and said transistor comprises a MOS transistor having a channel region formed in a silicon epitaxial layer grown on the silicon substrate simultaneously with the deposition of said poly-silicon film, and has a source region at least part of which is formed in at least part of said poly-silicon film.

According to another aspect of the invention there is provided a process of fabricating a semiconductor memory device comprising the steps of:

(a) providing a silicon substrate,
(b) forming a first silicon oxide film and a silicon nitride film on the silicon substrate,
(c) patterning the silicon nitride film,
(d) forming a trench in the silicon substrate,
(e) selectively oxidizing the silicon substrate using the silicon nitride film as a mask to form a second silicon oxide film,
(f) diffusing an impurity in said second silicon oxide film,
(g) removing said silicon nitride film and said first silicon oxide film to partially expose the surface of the silicon substrate, and
(h) forming an epitaxial silicon layer on said exposed part of the surface of the silicon substrate and a polysilicon layer on said second silicon oxide film.

DETAILED DESCRIPTION OF THE EMBODIMENTS

Figure 1:
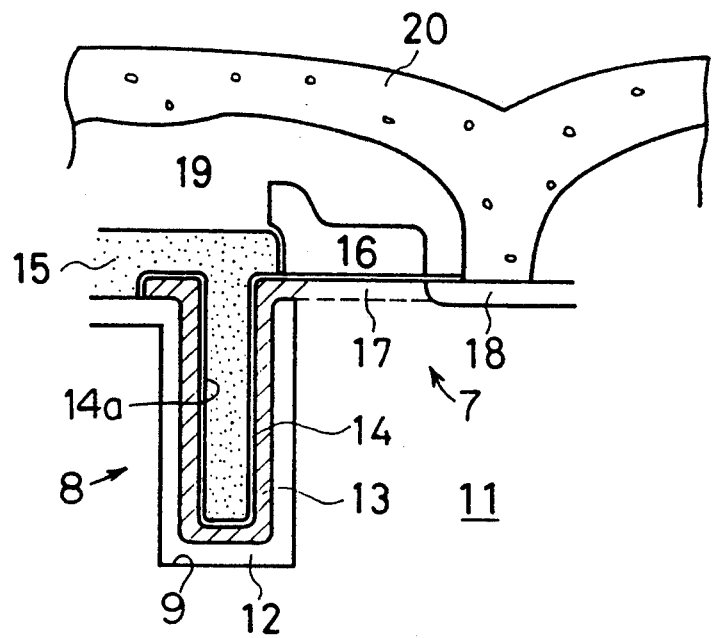
FIG. 1 is a cross sectional view showing a semiconductor memory device of a first embodiment of the present invention.

FIG. 1 is a cross sectional view of a memory cell of a dynamic random access memory of an embodiment of the invention.

The dynamic semiconductor memory device of this embodiment comprises a plurality of memory cells arranged in rows and columns to form a memory cell matrix, although the drawings show only one memory cell. Each memory cell comprises a switching transistor 7, a storage capacitor, 8 a trench 9 formed in a silicon substrate 11, and a first insulating film 12 formed of a thick silicon oxide ($SiO_2$) film to cover the interior of the trench 9.

The capacitor 8 comprises a storage electrode formed of at least part of a poly-silicon (poli-Si) film 13 deposited on the first insulating film 12, a second insulating film 14 formed of a thin $SiO_2$ film on the poly-silicon film 13 and a plate electrode 15 formed on the second insulating film 14. The second insulating film 14 is formed for example by oxidizing the surface of the poly-Si film 13.

The storage electrode 13 and the second insulating film 14 are so thin that the upper surface 14a of the second insulating film 14 form a trench configuration conforming to the trench 9 in the substrate 11. In other words, the thickness of the second insulating film 14 is substantially uniform throughout the area over which the second insulating film 14 separates the plate electrode 15 from the storage electrode 13.

The transistor 7 is an MOS transistor having a channel region formed in a silicon epitaxial layer 17 epitaxially grown on the silicon substrate simultaneously with the deposition of the poly-silicon film 13, a drain diffusion region 18, a source diffusion region at least part of which is formed in the poly-silicon film 13, and a gate electrode 16 formed over the channel region.

For example, the thickness of the storage electrode 13 is about 0.1 to 0.2 microns, and the thickness of the second insulating film 14 is about 200 Angstrom.

In the embodiment described, the second insulating film 14 is a silicon oxide film formed by oxidizing the surface of the poly-Si film 13. As a modification, the second insulating film 14 may alternatively be a silicon nitride film formed by nitrogenizing the surface of the poly-Si film 13.

In the illustrated memory cell, an electric charge is stored in the electrode 13 of the cell capacitor. At least part of the poly-Si is used as a memory node of the storage capacitor. Since electrode 13 is isolated and insulated from the Si substrate 11 by a relatively thick $SiO_2$ film 12, loss of electric charge due to mutual interference between adjacent cells resulting from leakage current due to punch-through. That is, the first insulating film 12 serves to prevent the memory cell from interfering with other parts of the memory device resulting from leakage current in the memory cell due to punch-through. Moreover, because of the thick oxide film 12, loss of electric charge due to incident alpha ($\alpha$) particles are also avoided.

The electrode 13 contains a diffused impurity and is used also as a source region of the transistor. It is therefore unnecessary to form a separate contact between the capacitor electrode and the source region.

Because the storage electrode 13 and the second insulating film 14 are so thin that the upper surface 14a of the second insulating film 14 form a trench configuration conforming to the trench 9 in the substrate 11, the capacitance of the capacitor 8 dependent on the surface of the insulating film 14 over which it separates the electrodes 13 and 15 of the capacitor 8 can readily be enlarged.

The features described above are advantageous in obtaining the size reduction or, in other words, in increasing the "density" of the device.

FIGS. 2A through 2E show the steps of fabrication of a semiconductor memory device shown in FIG. 1.

Figure 2A:
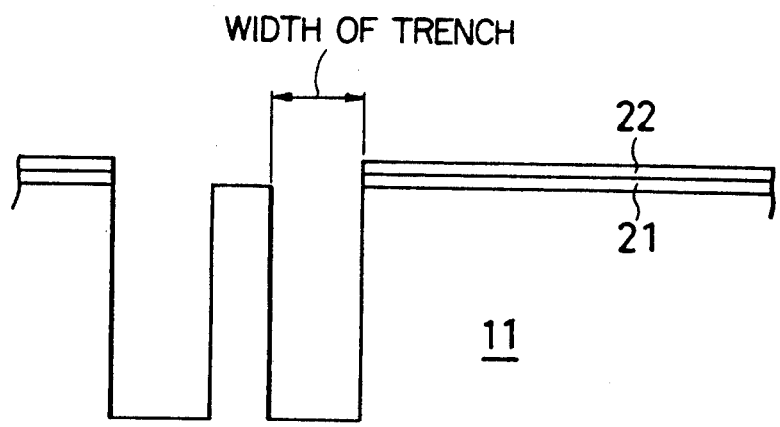
FIG. 2A through 2E are cross sectional views showing various steps of the fabrication of the semiconductor memory device of FIG. 1.

First, a silicon substrate 11 with (100) orientation is prepared. Then, a silicon oxide film 21 and a silicon nitride film 22 are formed on the silicon substrate 11. Predefined part of the oxide film and the nitride film are removed. A trench of a width of 1.5 microns, for example, is then formed (FIG. 2A).

Figure 2B:
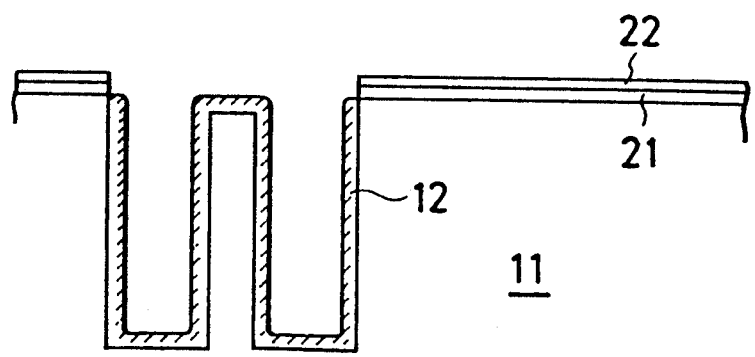
Figure 2C:
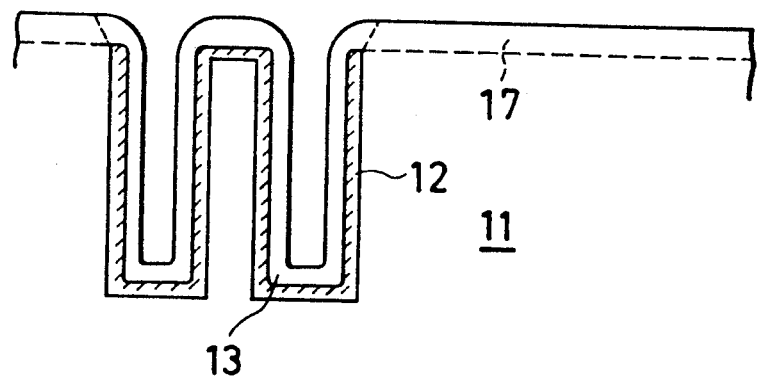

Then, using the silicon nitride film 22 as a mask, the silicon substrate 11 is selectively oxidized so that a thick $SiO_2$ film 12 of 1500 Å thick, for example, is formed. Then, phosphor (P) or arsenide (As) is diffused into the $SiO_2$ film 12 (FIG. 2B).

Then, the silicon nitride film 22 and the silicon oxide film 21 are removed. Chemical vapor deposition (CVD) of silicon is then performed to form an epitaxilly grown layer 17 of silicon of 0.1 to 0.2 microns thick, for example, on the silicon substrate, and at the same time polysilicon 13 is formed on the $SiO_2$ film 12 (FIG. 2C) to the same thickness, i.e., about 0.1 to 0.2 microns.

Figure 2D:
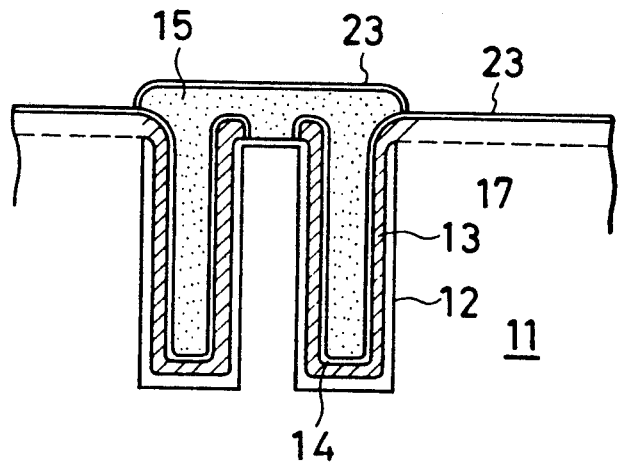

The deposited silicon layer is then patterned into a predefined shape. The surface of the poly-silicon layers are oxidized to form a thin $SiO_2$ film 14 of 200 Å, for example. An impurity-doped poly-silicon 15 is then deposited on the thin $SiO_2$ film 14, filling the trench. The poly-silicon 15 is thereafter patterned into a predefined shape. The surface of the poly-silicon film 15 and the silicon epitaxial layer 17 are oxidized so that an oxide film 23 is formed (FIG. 2D). During the oxidation, phosphor or arsenide is diffused from the $SiO_2$ film 12 in the trench into the poly-silicon 13 so that the poly-silicon 13 is doped into an n+ type.

Figure 2E:
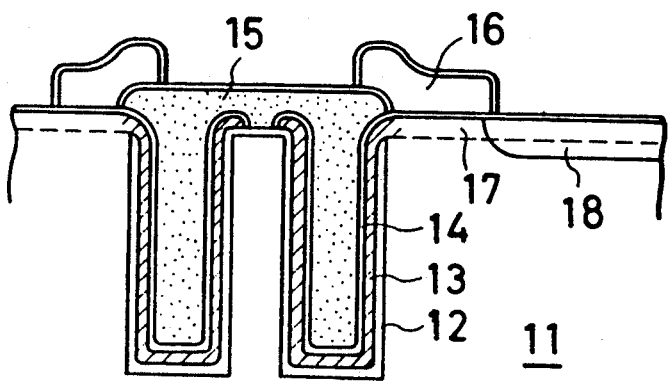

Then, poly-silicon 16, which will become a gate electrode of the transistor, is deposited and patterned. A drain diffusion region 18 is formed by ion-implantation (FIG. 2E).

Finally, an inter-layer insulator 19 is deposited. A contact hole is formed. Metalization and patterning are performed to form a metal conductor 20.

Figure 3:
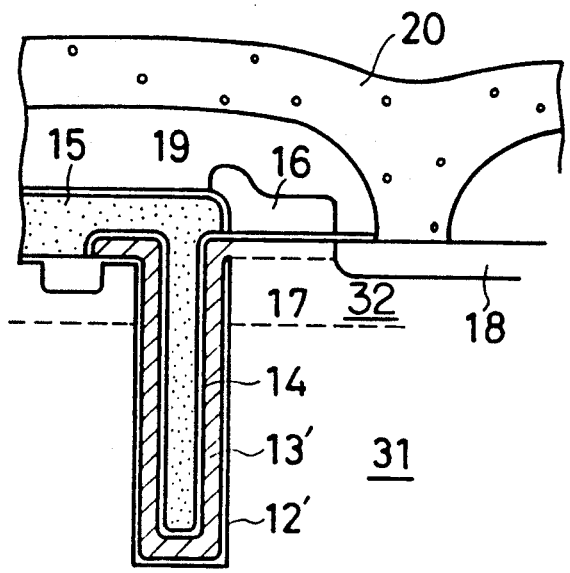
FIG. 3 is a cross sectional view showing a second embodiment of the invention.

FIG. 3 shows a second embodiment of a semiconductor memory device of the invention.

In this embodiment, the substrate comprises a p+ silicon substrate 31 and a p− silicon epitaxial layer 32 grown to a thickness of about 1 micron on the p+ silicon substrate 31. An $SiO_2$ film 12', which corresponds to the $SiO_2$ film 12 in FIG. 1, is made thin, 200 Å for example.

The rest of the structure is identical to that of the first embodiment. In the first embodiment, the oxide film 12 in the trench is thick so that the capacitance between the storage electrode (poly-silicon) 13 and the silicon substrate 11 is negligible. In the second embodiment, the capacitance between the storage electrode 13' and the silicon substrate 31 is large.

Figure 4:
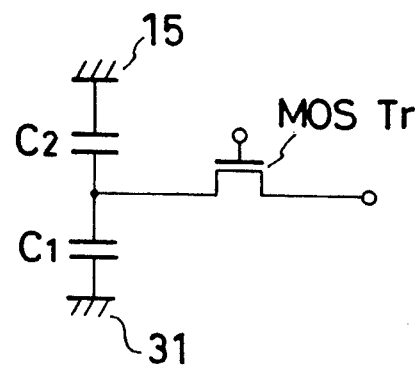
FIG. 4 is a diagram showing an equivalent circuit of the memory cell shown in FIG. 3.

If the potentials of the silicon substrate 31 and the plate electrode 15 are fixed at OV, an equivalent circuit of the memory cell of FIG. 3 will be as shown in FIG. 4. The storage electrode 13 has a capacitance C1 between itself and the silicon substrate and another capacitance C2 between itself and the plate electrode. The overall capacitance of the storage capacitor is thereby increased substantially.

Figure 5:
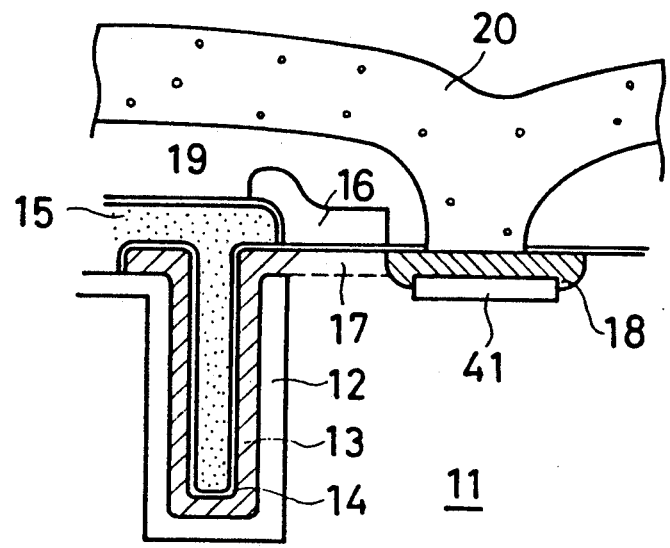
FIG. 5 is a cross sectional view showing a third embodiment of the invention.

FIG. 5 shows a third embodiment of a semiconductor memory device of the invention.

This embodiment is basically identical to the first embodiment, but differs from it in that an $SiO_2$ film 41 of 1500 Å thick, for example, is formed under part of the drain diffusion layer 18. The part of the drain diffusion layer 18 over the $SiO_2$ film 41 is therefore formed of poly-silicon. However since the drain diffusion layer 18 extends to a monocrystalline part, there is no problem in the performance of the device. In the third embodiment, most of the drain diffusion layer 18 is over the $SiO_2$ film 41, so that the junction capacitance between drain diffusion layer 18 and the substrate can be reduced. Accordingly, the bit line capacitance $C_B$ of the memory cell can be reduced. Since a smaller ratio $C_B/C_S$ of the bit line capacitance $C_B$ to the storage capacitance $C_S$ is preferred in a dynamic random access memory, the third embodiment with the reduced bit line capacitance $C_B$ is advantageous in this respect.

What is claimed is:

1. A memory cell of a dynamic semiconductor memory device, said memory cell comprising:
   a silicon substrate having a trench formed in a surface thereof;
   a first insulating film formed at a first thickness to cover an interior of said trench, said first insulating film terminating at one edge of said trench, said one edge of said trench being defined by said surface of said silicon substrate at an opening of said trench;
   a capacitor comprising (a) a lower electrode having an outer surface formed on said first insulating film and having one end terminating at said edge of said trench, (b) a second insulating film formed at a second thickness on said lower electrode, and (c) an upper electrode formed on said second insulating film; and
   a switching transistor comprising (a) a channel region formed at the surface of the silicon substrate having first and second ends, said first end of said channel region adjoining said one end of said lower electrode of said capacitor at said one edge of said trench, (b) a drain region adjoining said second end of said channel region, and (c) a gate electrode formed over said channel region and separated from said channel region by a gate insulating film;
   said first thickness of said first insulating film being sufficient to isolate said lower electrode from said silicon substrate;
   said switching transistor having at least a portion of a source region formed of said lower electrode of said capacitor.

2. A memory cell as recited in claim 1, wherein:

said lower electrode is formed of at least a portion of a poly-silicon film deposited on said first insulating layer;

said switching transistor is an MOS type transistor;

said channel region is formed in a silicon epitaxial layer epitaxially grown on said surface of said silicon substrate simultaneously with a deposition of said poly-silicon film;

said first thickness of said first insulating film being such that said first insulating film prevents the memory cell from interfering with other parts of the dynamic semiconductor memory device resulting from leakage current in the memory cell due to punch through.

3. A memory cell as recited in claim 1, wherein said first thickness film is about 1500 angstroms, and said second thickness is about 200 angstroms.

4. A memory cell as recited in claim 2, wherein said first thickness film is about 1500 angstroms, and said second thickness is about 200 angstroms.

5. A memory cell of a dynamic semiconductor memory device, said memory cell comprising:

a silicon substrate having a trench formed in a surface thereof;

a first insulating film formed at a first thickness to cover an interior of said trench, said first insulating film terminating at one edge of said trench, said one edge of said trench being defined by said surface of said silicon substrate at an opening of said trench;

a capacitor comprising (a) a lower electrode having an outer surface formed on said first insulating film and having one end terminating at said edge of said trench, (b) a second insulating film formed at a second thickness on said lower electrode, and (c) an upper electrode formed on said second insulating film; and a switching transistor comprising (a) a channel region formed at the surface of the silicon substrate having first and second ends, said first end of said channel region adjoining said one end of said lower electrode of said capacitor at said one edge of said trench, (b) a drain region adjoining said second end of said channel region, and (c) a gate electrode formed over said channel region and separated from said channel region by a gate insulating film;

said first thickness of said first insulating film being sufficient to isolate said lower electrode from said silicon substrate;

said switching transistor having at least a portion of a source region formed of said lower electrode of said capacitor;

wherein said gate electrode of said switching transistor partially extends over said upper electrode of said capacitor.

6. A memory cell as recited in claim 5, wherein:

said lower electrode is formed of at least a portion of a poly-silicon film deposited on said first insulating layer;

said switching transistor is an MOS type transistor;

said channel region is formed in a silicon epitaxial layer epitaxially grown on said surface of said silicon substrate simultaneously with a deposition of said poly-silicon film;

said first thickness of said first insulating film being such that said first insulating film prevents the memory cell from interfering with other parts of the dynamic semiconductor memory device resulting from leakage current in the memory cell due to punch through.

7. A memory cell of a dynamic semiconductor memory device, said memory cell comprising:

a silicon substrate having a trench formed in a surface thereof;

a first insulating film formed at a first thickness to cover an interior of said trench, said first insulating film terminating at one edge of said trench, said one edge of said trench being defined by said surface of said silicon substrate at an opening of said trench;

a capacitor comprising (a) a lower electrode having an outer surface formed on said first insulating film and having one end terminating at said edge of said trench, (b) a second insulating film formed at a second thickness on said lower electrode, and (c) an upper electrode formed on said second insulating film; and a switching transistor comprising (a) a channel region formed at the surface of the silicon substrate having first and second ends, said first end of said channel region adjoining said one end of said lower electrode of said capacitor at said one edge of said trench, (b) a drain region adjoining said second end of said channel region, and (c) a gate electrode formed over said channel region and separated from said channel region by a gate insulating film;

said first thickness of said first insulating film being sufficient to isolate said lower electrode from said silicon substrate;

said switching transistor having at least a portion of a source region formed of said lower electrode of said capacitor;

wherein said channel region and said drain region and said one end of said lower electrode extend in a same plane along said surface of said substrate.

8. A memory cell as recited in claim 6, wherein:

said lower electrode is formed of at least a portion of a poly-silicon film deposited on said first insulating layer;

said switching transistor is an MOS type transistor;

said channel region is formed in a silicon epitaxial layer epitaxially grown on said surface of said silicon substrate simultaneously with a deposition of said poly-silicon film;

said first thickness of said first insulating film being such that said first insulating film prevents the memory cell from interfering with other parts of the dynamic semiconductor memory device resulting from leakage current in the memory cell due to punch through.

* * * * *